United States Patent
Wei et al.

(10) Patent No.: US 6,847,046 B1
(45) Date of Patent: Jan. 25, 2005

(54) LIGHT-EMITTING DEVICE AND METHOD FOR MANUFACTURING THE SAME

(75) Inventors: Shih-Chen Wei, Miaoli Hsien (TW); Yung-Hsin Shie, Kaohsiung (TW); Wen-Liang Li, Tainan (TW); Shi-Ming Chen, No. 10, Da-Shuen 9th Rd., Tainan Science-Based Industrial Park, Hsinshi, Tainan County (TW)

(73) Assignees: Epitech Corporation, Ltd., Tainan (TW); Shi-Ming Chen, Tainan (TW)

( * ) Notice: Subject to any disclaimer, the term of this patent is extended or adjusted under 35 U.S.C. 154(b) by 0 days.

(21) Appl. No.: 10/748,256

(22) Filed: Dec. 31, 2003

(30) Foreign Application Priority Data

Oct. 31, 2003 (TW) ........................................ 92130584 A

(51) Int. Cl.⁷ .............................................. H01L 29/06
(52) U.S. Cl. ............................ 257/15; 257/22; 257/97; 257/190; 438/47
(58) Field of Search .............................. 257/15, 22, 96, 257/97, 190; 438/46, 47, 724, 744, 757, 791

(56) References Cited

U.S. PATENT DOCUMENTS

| | | | | |
|---|---|---|---|---|
| 4,863,245 A | * | 9/1989 | Roxlo | ........................ 359/276 |
| 5,576,579 A | * | 11/1996 | Agnello et al. | ............. 257/751 |
| 6,078,133 A | * | 6/2000 | Menu et al. | ................. 313/310 |
| 6,475,882 B1 | * | 11/2002 | Sakai et al. | .................. 438/483 |

* cited by examiner

*Primary Examiner*—Sara Crane
(74) *Attorney, Agent, or Firm*—Rabin & Berdo, P.C.

(57) ABSTRACT

A light-emitting device and a method for manufacturing the same are described, by forming a SiN/$Al_{1-x-y}In_xGa_yN$ ($0 \leq x \leq 1$, $0 \leq y \leq 1$, $x+y \leq 1$) superlattice layer between a substrate and an undoped GaN as a buffer layer, so as to reduce dislocation density of the buffer layer. In the SiN/$Al_{1-x-y}In_xGa_yN$($0 \leq x \leq 1, 0 \leq y \leq 1$, $x+y \leq 1$) superlattice layer, $Al_{1-x-y}In_xGa_yN$($0 \leq x \leq 1$, $0 \leq y \leq 1$, $x+y \leq 1$) can be n-type, p-type or undoped.

18 Claims, 4 Drawing Sheets

US 6,847,046 B1

LIGHT-EMITTING DEVICE AND METHOD FOR MANUFACTURING THE SAME

FIELD OF THE INVENTION

The present invention relates to a III-nitride device and a method for manufacturing the same, and more particularly, to a light-emitting device and a method for manufacturing the same using a SiN/Al$_{1-x-y}$In$_x$Ga$_y$N ($0 \leq x \leq 1$, $0 \leq y \leq 1$, $x+y \leq 1$) superlattice layer as a buffer layer.

BACKGROUND OF THE INVENTION

Semiconductor light-emitting devices, such as light emitting diodes (LED), are formed by using semiconductor materials. The semiconductor light emitting devices are one kind of minute solid-state light sources that can transform electrical energy into light energy. The semiconductor light emitting devices are not only small in volume, rapid in response speed, shockproof, long-lived, and use a low driving voltage, but also can meet the lightness, thinness, and miniaturization needs of various apparatuses, and thus have become very popular electric products in daily life.

In recent years, a great deal of attention has been directed to the light-emitting devices utilizing nitride-based semiconductors such as GaN, AlGaN, InGaN and AlInGaN. Usually, most of the light-emitting devices of the aforementioned type are grown on an electrically insulating sapphire substrate, which is different from other light-emitting devices utilizing conductive substrates.

Currently, when manufacturing a light-emitting device composed of nitride-based semiconductors, an AlInGaN material is grown at low temperature directly on a sapphire substrate to be used as a buffer layer. The dislocation density of the buffer layer is greatly increased, and the life of the light-emitting device is thereby reduced and the performance of the light-emitting device is degraded.

SUMMARY OF THE INVENTION

Therefore, an objective of the present invention is to provide a light-emitting device, by utilizing a SiN/Al$_{1-x-y}$In$_x$Ga$_y$N ($0 \leq x \leq 1$, $0 \leq y \leq 1$, $x+y \leq 1$) superlattice layer as a buffer layer to reduce the dislocation density of the buffer layer.

Another objective of the present invention is to provide a light-emitting device, by utilizing a SiN/Al$_{1-x-y}$In$_x$Ga$_y$N ($0 \leq x \leq 1$, $0 \leq y \leq 1$, $x+y \leq 1$) superlattice buffer layer to reduce the dislocation density. Therefore, the life of the light-emitting device can be prolonged, and the ability of electro-static discharge protection can be enhanced.

Still another objective of the present invention is to provide a method for manufacturing a light-emitting device. In the method for manufacturing the light-emitting device, a SiN/Al$_{1-x-y}$In$_x$Ga$_y$N ($0 \leq x \leq 1$, $0 \leq y \leq 1$, $x+y \leq 1$) superlattice buffer layer can be grown to reduce the dislocation density of the light-emitting device in a metal organic chemical vapor deposition (MOCVD) epitaxy apparatus, so that the fabrication cost can be greatly reduced in comparison with a conventional epitaxial laterally overgrown (ELOG) technique.

According to the aforementioned objectives of the present invention, the present invention provides a light-emitting device, comprising: a substrate; a SiN/Al$_{1-x-y}$In$_x$Ga$_y$N ($0 \leq x \leq 1$, $0 \leq y \leq 1$, $x+y \leq 1$) superlattice buffer layer located on the substrate; and an illuminant epitaxial structure located on the SiN/Al$_{1-x-y}$In$_x$Ga$_y$N ($0 \leq x \leq 1$, $0 \leq y \leq 1$, $x+y \leq 1$) superlattice buffer layer.

The illuminant epitaxial structure comprises: an un-doped GaN layer located on the SiN/Al$_{1-x-y}$In$_x$Ga$_y$N ($0 \leq x \leq 1$, $0 \leq y \leq 1$, $x+y \leq 1$) superlattice buffer layer; an n-type GaN layer located on the un-doped GaN layer; a multi-quantum well (MQW) active layer located on the n-type GaN layer; a p-type AlGaN layer located on the multi-quantum well (MQW) active layer; and a p-type GaN layer located on the p-type AlGaN layer.

According to a preferred embodiment of the present invention, the material of the substrate is sapphire. The thickness of the SiN/Al$_{1-x-y}$In$_x$Ga$_y$N ($0 \leq x \leq 1$, $0 \leq y \leq 1$, $x+y \leq 1$) superlattice buffer layer is between about 10 Å and 2000 Å. The thickness of the un-doped GaN layer is about 1 μm. The thickness of the n-type GaN layer is about 2 μm and the n-type GaN layer is Si-doped. The multi-quantum well active layer is composed of InGaN/GaN, in which the thickness of the InGaN is about 30 Å and the thickness of the GaN is about 150 Å. The thickness of the AlGaN layer is about 20 nm and the AlGaN layer is Mg-doped. The thickness of the p-type GaN layer is about 0.2 μm and the AlGaN layer is Mg-doped.

According to the aforementioned objectives of the present invention, the present invention provides a method for manufacturing a light-emitting device, comprising: providing a substrate; forming a SiN/Al$_{1-x-y}$In$_x$Ga$_y$N ($0 \leq x \leq 1$, $0 \leq y \leq 1$, $x+y \leq 1$) superlattice buffer layer on the substrate; and forming an illuminant epitaxial structure on the SiN/Al$_{1-x-y}$In$_x$Ga$_y$N ($0 \leq x \leq 1$, $0 \leq y \leq 1$, $x+y \leq 1$) superlattice buffer layer.

According to a preferred embodiment of the present invention, the step of forming the SiN/Al$_{1-x-y}$In$_x$Ga$_y$N ($0 \leq x \leq 1$, $0 \leq y \leq 1$, $x+y \leq 1$) superlattice buffer layer is performed by a low-temperature metal organic chemical vapor deposition method. The reaction temperature is preferably controlled between about 200° C. and 900° C., and more preferably at about 520° C.

By utilizing a SiN/Al$_{1-x-y}$In$_x$Ga$_y$N ($0 \leq x \leq 1$, $0 \leq y \leq 1$, $x+y \leq 1$) superlattice layer as a buffer layer, the dislocation density of the buffer layer can be reduced. The life of the light-emitting device thereby is prolonged and the ability of electrostatic discharge protection can be enhanced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a light-emitting device and a method for manufacturing the same, by using a SiN/Al$_{1-x-y}$In$_x$Ga$_y$N (0≦x≦1, 0≦y≦1, x+y≦1) superlattice structure as a buffer layer to reduce the dislocation density of the buffer layer. The life of the light-emitting device can be prolonged and the ability of electro-static discharge protection can be enhanced. In order to make the illustration of the present invention more explicitly and completely, the following description is stated with reference to the accompanying drawings of FIG. 1 to FIG. 5.

Figure 1:
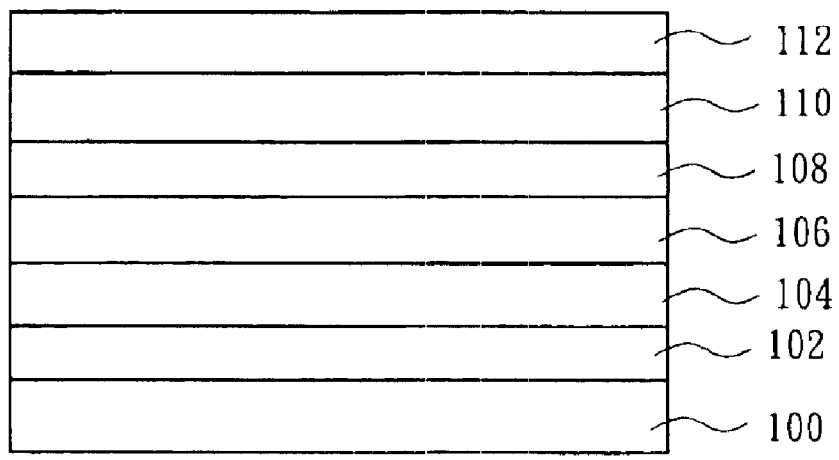
FIG. 1 and FIG. 2 are schematic flow diagrams showing the process for manufacturing a light-emitting device in accordance with a preferred embodiment of the present invention.
Figure 2:
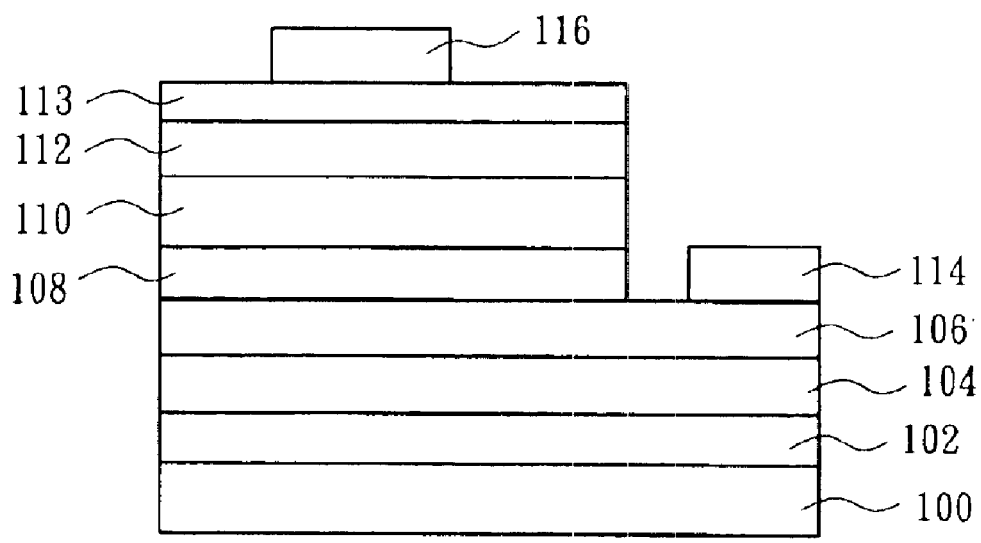

Referring to FIG. 1 and FIG. 2, FIG. 1 and FIG. 2 are schematic flow diagrams showing the process for manufacturing a light-emitting device in accordance with a preferred embodiment of the present invention. The light-emitting device of the present invention can be a light-emitting diode or a laser diode, for example. In manufacturing of the light-emitting device of the present invention, a substrate 100 is provided. The material of the substrate 100 is preferably transparent, and the material of the substrate 100 can be, for example, Al$_2$O$_3$, SiC, Si, GaN or GaAs. The material of the substrate 100 is preferably sapphire. Then, a thermal cleaning step is performed on the substrate 100. The thermal cleaning step is preferably performed in a H$_2$ ambient at 1200° C. to clean the substrate 100. After completing the thermal cleaning step of the substrate 100, a buffer layer 102 is grown on the substrate 100, for example, by low temperature metal organic chemical vapor deposition. The buffer layer 102 is composed of a SiN/Al$_{1-x-y}$In$_x$Ga$_y$N (0≦x≦1, 0≦y≦1, x+y≦1) superlattice structure. While the buffer layer 102 is grown, the temperature is preferably controlled between about 200° C. and 900° C., and more preferably at about 520° C. For example, trimethylgalliaum (TMGa), trimethylaluminum (TMAl) and NH$_3$ are used as precursors, and S$_2$H$_6$ and bis-cyclopentadienyl magnesium (Cp2Mg) are used as dopants. When SiN of the buffer layer 102 is grown, the flow rate of NH$_3$ is preferably about 8 slm, and the flow rate of S$_2$H$_6$ is preferably about 2.5 sccm. In a preferred embodiment of the present invention, the thickness of the buffer layer 102 composed of the SiN/Al$_{1-x-y}$In$_x$Ga$_y$N (0≦x≦1, 0≦y≦1, x+y≦1) superlattice structure is preferably between about 10 Å and 2000 Å, and the thickness of the buffer layer 102 is more preferably about 300 Å. The SiN/Al$_{1-x-y}$In$_x$Ga$_y$N (0≦x≦1, 0≦y≦1, x+y≦1) of the buffer layer 102 can be n-type, p-type or un-doped. In the buffer layer 102, the SiN/Al$_{1-x-y}$In$_x$Ga$_y$N (0≦x≦1, 0≦y≦1, x+y≦1) superlattice structure can be composed of SiN/Al$_{1-x-y}$In$_x$Ga$_y$N (0≦x≦1, 0≦y≦1, x+y≦1) structures or Al$_{1-x-y}$In$_x$Ga$_y$N (0≦x≦1, 0≦y≦1, x+y≦1)/SiN structures, and the number of the SiN/Al$_{1-x-y}$In$_x$Ga$_y$N (0≦x≦1, 0≦y≦1, x+y≦1) structures or the Al$_{1-x-y}$In$_x$Ga$_y$N (0≦x≦1, 0≦y≦1, x+y≦1)/SiN structures is greater than or equal to 2. The material in the buffer layer in contact with the substrate 100 can be SiN or Al$_{1-x-y}$In$_x$Ga$_y$N (0≦x≦1, 0≦y≦1, x+y≦1).

One feature of the present invention is that the buffer layer 102 composed of the SiN/Al$_{1-x-y}$In$_x$Ga$_y$N (0≦x≦1, 0≦y≦1, x+y≦1) superlattice structure is grown on the substrate 100, so that the dislocation density of the buffer layer 102 can be reduced. Therefore, the life of the light-emitting device can be effectively prolonged, and the efficiency of electro-static discharge protection of the light-emitting device can be improved.

After completing the buffer layer 102 composed of the SiN/Al$_{1-x-y}$In$_x$Ga$_y$N (0≦x≦1, 0≦y≦1, x+y≦1) superlattice structure, the process temperature is raised to about 1180° C., and an illuminant epitaxial structure of the light-emitting device is grown on the buffer layer 102 by, for example, a metal organic chemical vapor deposition at this temperature. First, an un-doped GaN layer 104 is grown on the buffer layer. The thickness of the un-doped GaN layer 104 is preferably about 1 μm. An n-type GaN layer 106 is grown on the un-doped GaN layer 104. The n-type GaN layer 106 is preferably Si-doped, and the thickness of the n-type GaN layer 106 is preferably 2 μm. Then, a multi-quantum well active layer 108 is grown on the n-type GaN layer 106. The multi-quantum well active layer 108 is composed of an InGaN layer/GaN layer structure, for example, the thickness of the InGaN layer is preferably about 30 Å, and the thickness of the GaN layer is preferably about 150 Å. Next, a p-type AlGaN layer 110 is grown on the multi-quantum well active layer 108. The p-type AlGaN layer 110 is preferably Mg-doped, and the thickness of the p-type AlGaN layer 110 is preferably about 20 nm. Subsequently, a p-type GaN layer 112 is grown on the p-type AlGaN layer 110 to form a structure illustrated in FIG. 1. The p-type GaN layer 112 is preferably Mg-doped, and the thickness of the p-type GaN layer 112 is preferably 0.2 μm.

After the illuminant epitaxial structure of the light-emitting device is completed, the substrate 100 together with the buffer layer 102 and the illuminant epitaxial structure are placed in a thermal processing apparatus, such as a thermal furnace, and are annealed for about 20 minutes in a N$_2$ ambient at about 700° C. Next, a definition step is performed by photolithography and etching to remove a portion of the p-type GaN layer 112, a portion of the p-type AlGaN layer 110 and a portion of the multi-quantum well active layer 108 until a portion of the n-type GaN layer 106 is exposed. Then, an electrode 114 is formed on a portion of the exposed n-type GaN layer 106 by evaporation, a transparent electrode layer 113 is formed on the p-type GaN layer 112, and an electrode 116 is formed on a portion of the transparent electrode layer 113 to complete the fabrication of the light-emitting device, such as that illustrated in FIG. 2. The electrode 114 is preferably a Ti/Al/Ni/Au structure, and the electrode 116 is preferably a Ni/Au structure.

Figure 3:
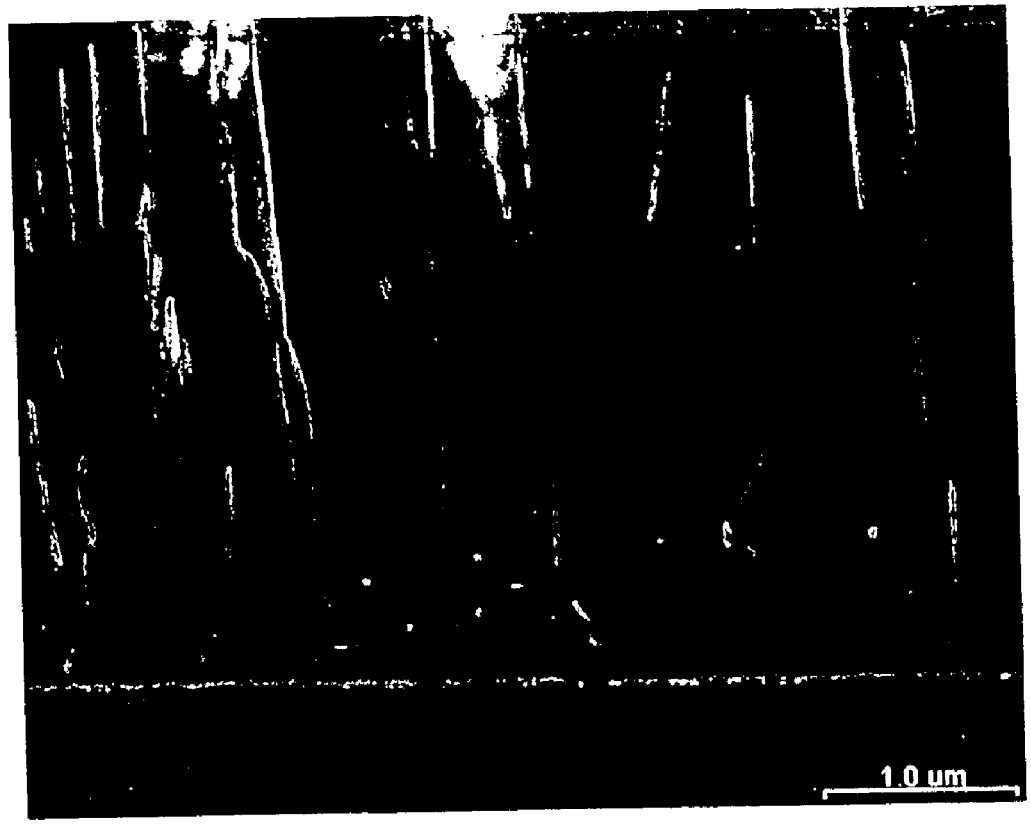
FIG. 3 is a transmission electron microscopy diagram of a buffer layer composed of a GaN single layer.
Figure 4:
FIG. 4 is a transmission electron microscopy diagram of a SiN/Al$_{1-x-y}$In$_x$Ga$_y$N ($0 \leq x \leq 1$, $0 \leq y \leq 1$, $x+y \leq 1$) superlattice buffer layer.

FIG. 3 is a transmission electron microscopy (TEM) diagram of a buffer layer composed of a GaN single layer. When compared to the transmission electron microscopy diagram of a SiN/Al$_{1-x-y}$In$_x$Ga$_y$N (0≦x≦1, 0≦y≦1, x+y≦1) superlattice buffer layer shown in FIG. 4, the dislocation density of the SiN/Al$_{1-x-y}$In$_x$Ga$_y$N (0≦x≦1, 0≦y≦1, x+y≦1) superlattice buffer layer is obviously greatly reduced.

Figure 5:
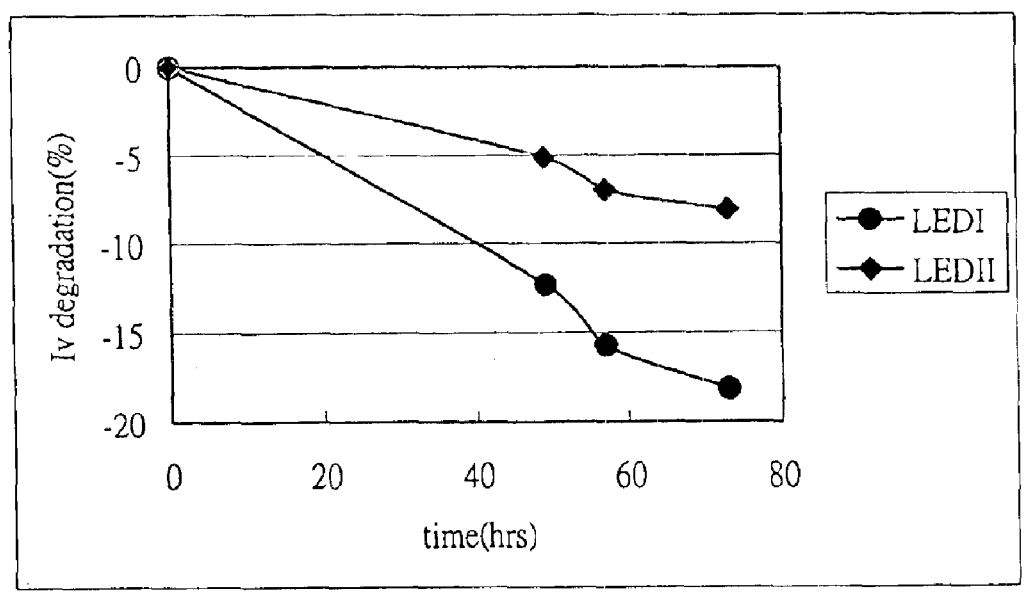
FIG. 5 is a comparison diagram of life-test between a buffer layer composed of a GaN single layer and a SiN/Al$_{1-x-y}$In$_x$Ga$_y$N ($0 \leq x \leq 1$, $0 \leq y \leq 1$, $x+y \leq 1$) superlattice buffer layer.

FIG. 5 is a life-test comparison diagram between a buffer layer composed of a GaN single layer and a SiN/Al$_{1-x-y}$In$_x$Ga$_y$N (0≦x≦1, 0≦y≦1, x+y≦1) superlattice buffer layer. The testing is performed on the condition of 50 mA and 85° C. In FIG. 5, LEDI represents a GaN series light-emitting diode using a GaN single layer as a buffer layer, and the LEDII represents a GaN series light-emitting diode composed of a SiN/Al$_{1-x-y}$In$_x$Ga$_y$N (0≦x≦1, 0≦y≦1, x+y≦1) superlattice buffer layer. FIG. 5 shows that the illuminant intensity of LEDI degrades 12% and the illuminant intensity of LEDII degrades 5% at 49 hours, and the illuminant intensity of LEDI degrades 18% and the illuminant intensity of LEDII degrades 8% at 73 hours. The rapid degradation of the illuminant intensity of LEDI results from the dislocation density of the GaN series light-emitting diode using a GaN single layer as a buffer layer being so high, and the electro-static discharge protection performance of the GaN series light-emitting diode composed of the SiN/Al$_{1-x-y}$In$_x$Ga$_y$N (0≦x≦1, 0≦y≦1, x+y≦1) superlattice buffer layer being about one time of that of the GaN series light-emitting diode using a GaN single layer as a buffer layer. The electro-static discharge protection ability of the GaN series light-emitting diode composed of the SiN/Al$_{1-x-y}$In$_x$Ga$_y$N (0≦x≦1, 0≦y≦1, x+y≦1) superlattice buffer layer can be up to 950V, and the electro-static discharge protection ability of the GaN series light-emitting diode using a GaN single layer as a buffer layer is merely 450V. The difference of the electro-static discharge protection abilities of LEDI and LEDII is caused by the difference of the dislocation density amounts of LEDI and LEDII.

According to the aforementioned description, one advantage of the present invention is that the present invention uses a SiN/Al$_{1-x-y}$In$_x$Ga$_y$N ($0 \leq x \leq 1$, $0 \leq y \leq 1$, $x+y \leq 1$) superlattice layer as a buffer layer, so the objective of reducing the dislocation density of the buffer layer can be achieved.

According to the aforementioned description, the other advantage of the present invention is that the dislocation density of the light-emitting device can be reduced by growing a SiN/Al$_{1-x-y}$In$_x$Ga$_y$N ($0 \leq x \leq 1$, $0 \leq y \leq 1$, $x+y \leq 1$) superlattice buffer layer on a substrate; the life of the light-emitting device can therefore be increased, and the electro-static discharge protection ability of the light-emitting device can be enhanced.

According to the aforementioned description, still another advantage of the present invention is that when manufacturing the light-emitting device of the present invention, a SiN/Al$_{1-x-y}$In$_x$Ga$_y$N ($0 \leq x \leq 1$, $0 \leq y \leq 1$, $x+y \leq 1$) superlattice buffer layer can be grown to reduce the dislocation density of the light-emitting device in a metal organic chemical vapor deposition epitaxy apparatus directly, so the fabrication cost can be greatly reduced.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting device, comprising:
   a substrate;
   a SiN/Al$_{1-x-y}$In$_x$Ga$_y$N ($0 \leq x \leq 1$, $0 \leq y \leq 1$, $x+y \leq 1$) superlattice buffer layer located on the substrate; and
   an illuminant epitaxial structure located on the SiN/Al$_{1-x-y}$In$_x$Ga$_y$N ($0 \leq x \leq 1$, $0 \leq y \leq 1$, $x+y \leq 1$) superlattice buffer layer.

2. The light-emitting device according to claim 1, wherein the substrate is a transparent substrate.

3. The light-emitting device according to claim 1, wherein the substrate is a sapphire substrate.

4. The light-emitting device according to claim 1, wherein a material of the substrate is selected from the group consisting of Al$_2$O$_3$, SiC, Si, GaN and GaAs.

5. The light-emitting device according to claim 1, wherein a thickness of the SiN/Al$_{1-x-y}$In$_x$Ga$_y$N ($0 \leq x \leq 1$, $0 \leq y \leq 1$, $x+y \leq 1$) superlattice buffer layer is between about 10 Å and 2000 Å.

6. The light-emitting device according to claim 1, wherein a number of SiN/Al$_{1-x-y}$In$_x$Ga$_y$N ($0 \leq x \leq 1$, $0 \leq y \leq 1$, $x+y \leq 1$) structures in the SiN/Al$_{1-x-y}$In$_x$Ga$_y$N ($0 \leq x \leq 1$, $0 \leq y \leq 1$, $x+y \leq 1$) superlattice buffer layer is greater than or equal to 2.

7. The light-emitting device according to claim 1, wherein a composition of the SiN/Al$_{1-x-y}$In$_x$Ga$_y$N ($0 \leq x \leq 1$, $0 \leq y \leq 1$, $x+y \leq 1$) superlattice buffer layer is selected from the group consisting of a Al$_{1-x-y}$In$_x$Ga$_y$N ($0 \leq x \leq 1$, $0 \leq y \leq 1$, $x+y \leq 1$)/SiN structure and a SiN/Al$_{1-x-y}$In$_x$Ga$_y$N ($0 \leq x \leq 1$, $0 \leq y \leq 1$, $x+y \leq 1$) structure, and a material in contact with the substrate is selected from the group consisting of SiN and Al$_{1-x-y}$In$_x$Ga$_y$N ($0 \leq x \leq 1$, $0 \leq y \leq 1$, $x+y \leq 1$).

8. The light-emitting device according to claim 1, wherein the light-emitting device is selected from the group consisting of a light-emitting diode and a laser diode.

9. A method for manufacturing a light-emitting device, comprising:
   providing a substrate;
   forming a SiN/Al$_{1-x-y}$In$_x$Ga$_y$N ($0 \leq x \leq 1$, $0 \leq y \leq 1$, $x+y \leq 1$) superlattice buffer layer on the substrate; and
   forming an illuminant epitaxial structure on the SiN/Al$_{1-x-y}$In$_x$Ga$_y$N ($0 \leq x \leq 1$, $0 \leq y \leq 1$, $x+y \leq 1$) superlattice buffer layer.

10. The method for manufacturing a light-emitting device according to claim 9, wherein in the step of forming the SiN/Al$_{1-x-y}$In$_x$Ga$_y$N ($0 \leq x \leq 1$, $0 \leq y \leq 1$, $x+y \leq 1$) superlattice buffer layer, a temperature for growing SiN of the SiN/Al$_{1-x-y}$In$_x$Ga$_y$N ($0 \leq x \leq 1$, $0 \leq y \leq 1$, $x+y \leq 1$) superlattice buffer layer is between about 200° C. and 900° C.

11. The method for manufacturing a light-emitting device according to claim 9, wherein in the step of forming the SiN/Al$_{1-x-y}$In$_x$Ga$_y$N ($0 \leq x \leq 1$, $0 \leq y \leq 1$, $x+y \leq 1$) superlattice buffer layer, a temperature for growing Al$_{1-x-y}$In$_x$Ga$_y$N ($0 \leq x \leq 1$, $0 \leq y \leq 1$, $x+y \leq 1$) of the SiN/Al$_{1-x-y}$In$_x$Ga$_y$N ($0 \leq x \leq 1$, $0 \leq y \leq 1$, $x+y \leq 1$) superlattice buffer layer is between about 200° C. and 900° C.

12. The method for manufacturing a light-emitting device according to claim 9, wherein the substrate is a transparent substrate.

13. The method for manufacturing a light-emitting device according to claim 9, wherein the substrate is a sapphire substrate.

14. The method for manufacturing a light-emitting device according to claim 9, wherein a material of the substrate is selected from the group consisting of Al$_2$O$_3$, SiC, Si, GaN and GaAs.

15. The method for manufacturing a light-emitting device according to claim 9, wherein a thickness of the SiN/Al$_{1-x-y}$In$_x$Ga$_y$N ($0 \leq x \leq 1$, $0 \leq y \leq 1$, $x+y \leq 1$) superlattice buffer layer is between about 10 Å and 2000 Å.

16. The method for manufacturing a light-emitting device according to claim 9, wherein a number of SiN/Al$_{1-x-y}$In$_x$Ga$_y$N ($0 \leq x \leq 1$, $0 \leq y \leq 1$, $x+y \leq 1$) structures in the SiN/Al$_{1-x-y}$In$_x$Ga$_y$N ($0 \leq x \leq 1$, $0 \leq y \leq 1$, $x+y \leq 1$) superlattice buffer layer is greater than or equal to 2.

17. The method for manufacturing a light-emitting device according to claim 9, wherein a composition of the SiN/Al$_{1-x-y}$In$_x$Ga$_y$N ($0 \leq x \leq 1$, $0 \leq y \leq 1$, $x+y \leq 1$) superlattice buffer layer is selected from the group consisting of a Al$_{1-x-y}$In$_x$Ga$_y$N ($0 \leq x \leq 1$, $0 \leq y \leq 1$, $x+y \leq 1$)/SiN structure and a SiN/Al$_{1-x-y}$In$_x$Ga$_y$N ($0 \leq x \leq 1$, $0 \leq y \leq 1$, $x+y \leq 1$) structure, and a material in contact with the substrate is selected from the group consisting of SiN and Al$_{1-x-y}$In$_x$Ga$_y$N ($0 \leq x \leq 1$, $0 \leq y \leq 1$, $x+y \leq 1$).

18. The method for manufacturing a light-emitting device according to claim 9, wherein the light-emitting device is selected from the group consisting of a light-emitting diode and a laser diode.

* * * * *